United States Patent [19]

Okayama et al.

[11] Patent Number: 5,640,158

[45] Date of Patent: Jun. 17, 1997

[54] REVERSIBLE METHOD OF ENCODING DATA

[75] Inventors: Toshiaki Okayama; Noboru Kitazawa, both of Nagano-ken, Japan

[73] Assignee: Seiko Epson Corporation, Tokyo, Japan

[21] Appl. No.: 527,904

[22] Filed: Sep. 14, 1995

[30] Foreign Application Priority Data

Sep. 14, 1994 [JP] Japan .................. 6-246932

[51] Int. Cl.$^6$ .................................................. H03M 7/38
[52] U.S. Cl. .................................................. 341/51
[58] Field of Search .................. 341/51, 55, 67, 341/82

[56] References Cited

U.S. PATENT DOCUMENTS 5,534,861  7/1996  Chang et al. .................. 341/51
5,572,206  11/1996  Miller et al. .................. 341/51

OTHER PUBLICATIONS

"Techniques of Storing Information with Compression", pp. 1–3.

"Data Compression Algorithm",, pp. 1–6.

*Primary Examiner*—Todd E. DeBoer
*Attorney, Agent, or Firm*—Loeb & Loeb LLP

[57] ABSTRACT

A method of reversible data compression is disclosed. The method is an improvement on the Lempel-Ziv data compression method that does not require a prefix for every noncompressed data unit in the encoded data stream. A code is inserted at the beginning of each string of consecutive noncompressed data bytes to indicate that the string is of noncompressed data and the number of bytes in the string. By eliminating the requirement for a separate prefix for each noncompressed data, a higher compression ratio is achieved over conventional Lempel-Ziv encoding methods.

29 Claims, 8 Drawing Sheets

(A) Example 1
Input Data Stream:

Compressed Data: OFFSET (3) + LENGTH (2)

(B) Example 2
Input Data Stream:

Compressed Data: OFFSET (3) + LENGTH (3)

(C) Example 3
Input Data Stream:

Compressed Data: OFFSET (1) + LENGTH (4)

FIG. 4

<END> = <00><00000000000>
         |            |
       WN(1)      OFFSET (0)

FIG. 5(a)

<LZS> = <WN> <LZ> <LZ> ... <LZ> <00000000000>
          |   \_______N units_______/         |
       WN(N+1)                          <END> = OFFSET (0)

REVERSIBLE METHOD OF ENCODING DATA

BACKGROUND OF THE INVENTION

This invention relates to a method of reversibly encoding a compressed data stream. In recent years, technologies to compress data have come to be widely used to accommodate the rapid increase in the amount of data processed by computers. In data compression technology, reversible encoding methods allow restoring data to the state before compression and non-reversible encoding methods do not allow restoration of data to its original state. The non-reversible encoding methods are primarily used in compressing image data. The reversible encoding methods are generally used in compressing data such as program data, text data and dictionary data.

An example of a reversible encoding method is the so-called LZ (Lempel-Ziv) method. This encoding method entails examining whether or not the data string to be compressed matches any data string that appeared previously in the data stream. If there is a data string that matches, this particular method codifies the data string with the length of the data string and the separation between the matching data strings (offset) in the data stream. "Data string" here means a series of data in prescribed units (for example, one byte). If there is no previous data string that matches with the data string to be compressed, the noncompressed (also called "solid") data string itself is appended to the encoded data string.

The format of a conventional LZ-type encoded data string is illustrated below.

<Suffix> <Noncompressed byte data or LZ compressed data>Repeat

Since there is a mix of noncompressed-type byte data and LZ-type compressed data (includes encoded data for matching length and the offset) in the entire encoded data stream, a prefix is attached to each encoded data unit as an identifier. A single unit of encoded data can be either a noncompressed data byte or an LZ compressed data unit.

Figure 1:
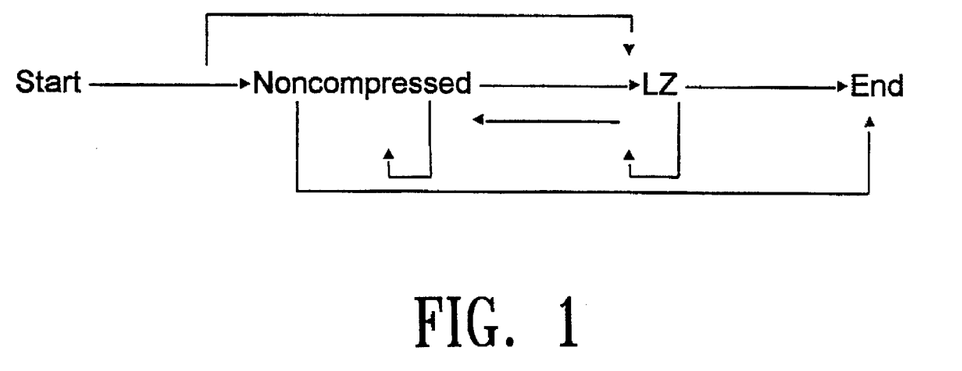
FIG. 1 is a state transition diagram of the conventional Lempel-Ziv data compression method.

FIG. 1 is a state transition diagram of data compression under the conventional LZ encoding method. In previous methods, the noncompressed-type byte data and the LZ-type compressed data were aligned in an arbitrary order. Because of this, a prefix was attached to each unit of encoded data at the time of compression in order to identify each type of encoded data unit when the data is expanded.

In the conventional LZ-type encoding method, a sufficient compression ratio is not necessarily achieved in the event a large percentage of the encoded data stream is noncompressed-type data because the conventional method requires the attachment of a prefix to each encoded data unit. The invention described herein offers a reversible encoding method for data that provides relatively high compression ratio even if the resulting encoded data stream has a large percentage of noncompressed-type data units.

SUMMARY OF THE INVENTION

An object of the present invention is to provide a reversible data compression method with a high compression ratio.

It is another object of the present invention to provide an improvement to the Lempel-Ziv method of data compression that does not require the insertion of a prefix for each unit of encoded data.

Briefly, the described method includes comparing a plurality of sequential data bytes that are not encoded to encoded data to determine the longest match therewith, appending to an encoded data stream a compressed data unit corresponding to each match exceeding a predetermined length, inserting a code into each string of consecutive compressed data units indicating the number of compressed data units in the string, appending each byte not contained in a match to previous bytes in the data stream exceeding a predetermined length to the encoded data stream, and inserting a code into each string of consecutive noncompressed data bytes to indicate the number of noncompressed data bytes in the string.

Since each string of consecutive noncompressed data units includes a code that indicates the number of units in the string, a relatively high compression ratio can be obtained even if a high percentage of the data is not compressed. Using this type of unit encoding data, it is possible to encode a first byte string with a small amount of data. In this manner, the compression ratio is enhanced because the respective types of encoded data, compressed and noncompressed, can be distinguished without including a prefix or suffix for each encoded data unit.

DETAILED DESCRIPTION OF THE FIGURES

Figure 2:
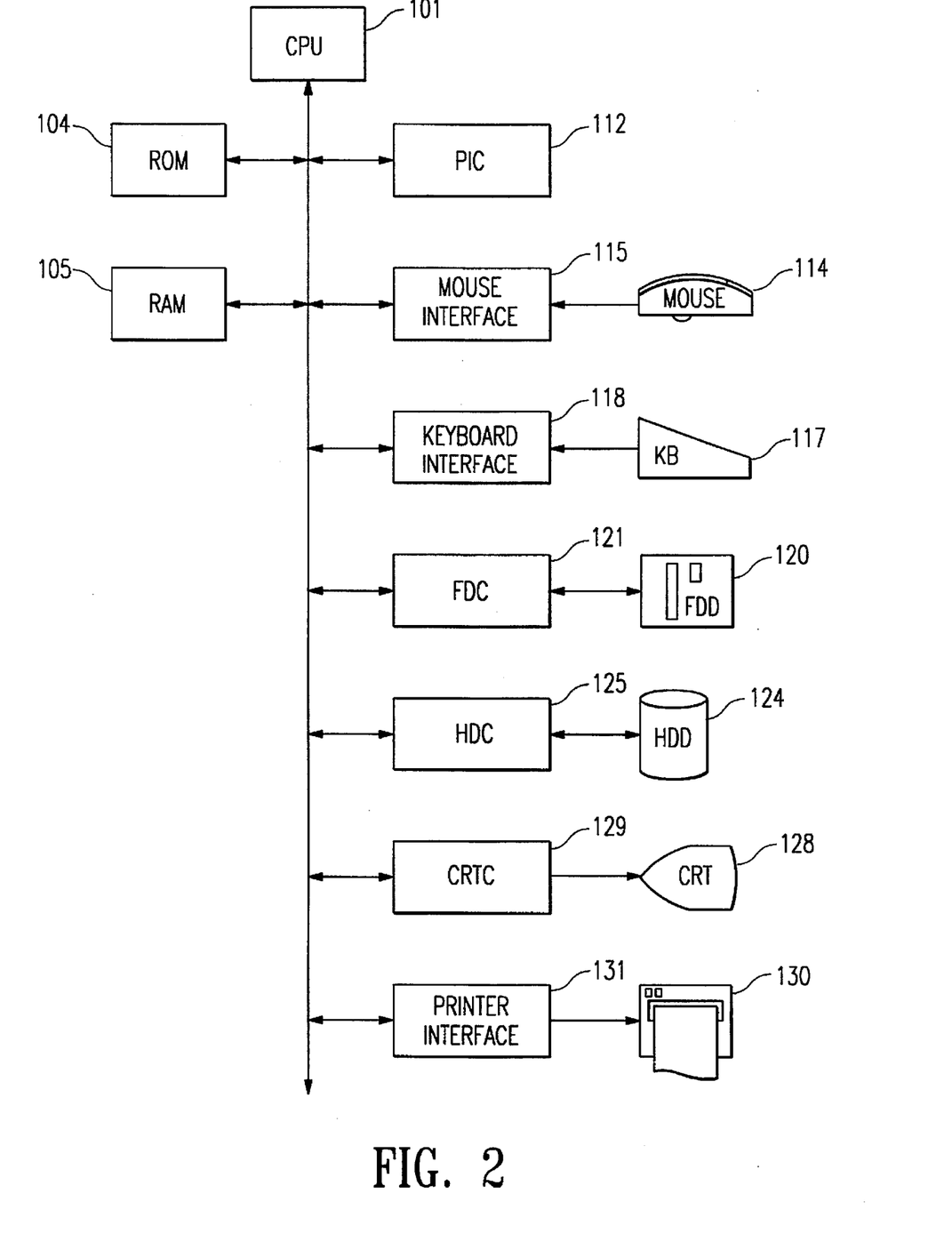
FIG. 2 is a block diagram showing a hardware configuration of an information processing system for employing a preferred embodiment.

FIG. 2 is a block diagram that shows the hardware configuration of the information processing system used in an execution example for a preferred embodiment of the present invention. This information processing system may be configured as a personal computer system. As shown in FIG. 2, the system includes of the following sections mutually linked by a bus coupled to CPU 101. Read only memory ROM 104 stores monitor programs. Random access memory RAM 105 provides the main memory. Interrupt controller PIC 112 controls various interrupts by attaching a priority. Mouse interface 115 provides an interface that governs exchanges between two-button mouse 114 and data. Keyboard interface 118 provides an interface that governs key input from keyboard 117. Flexible disk drive controller FDC 121 controls flexible disk drive FDD 120. Hard disk drive controller HDC 125 controls hard disk drive HDD 124. CRT controller CRTC 129 controls the signal output to CRT 128 which displays data. Printer interface 131 controls data output to printer 130.

Figure 3:
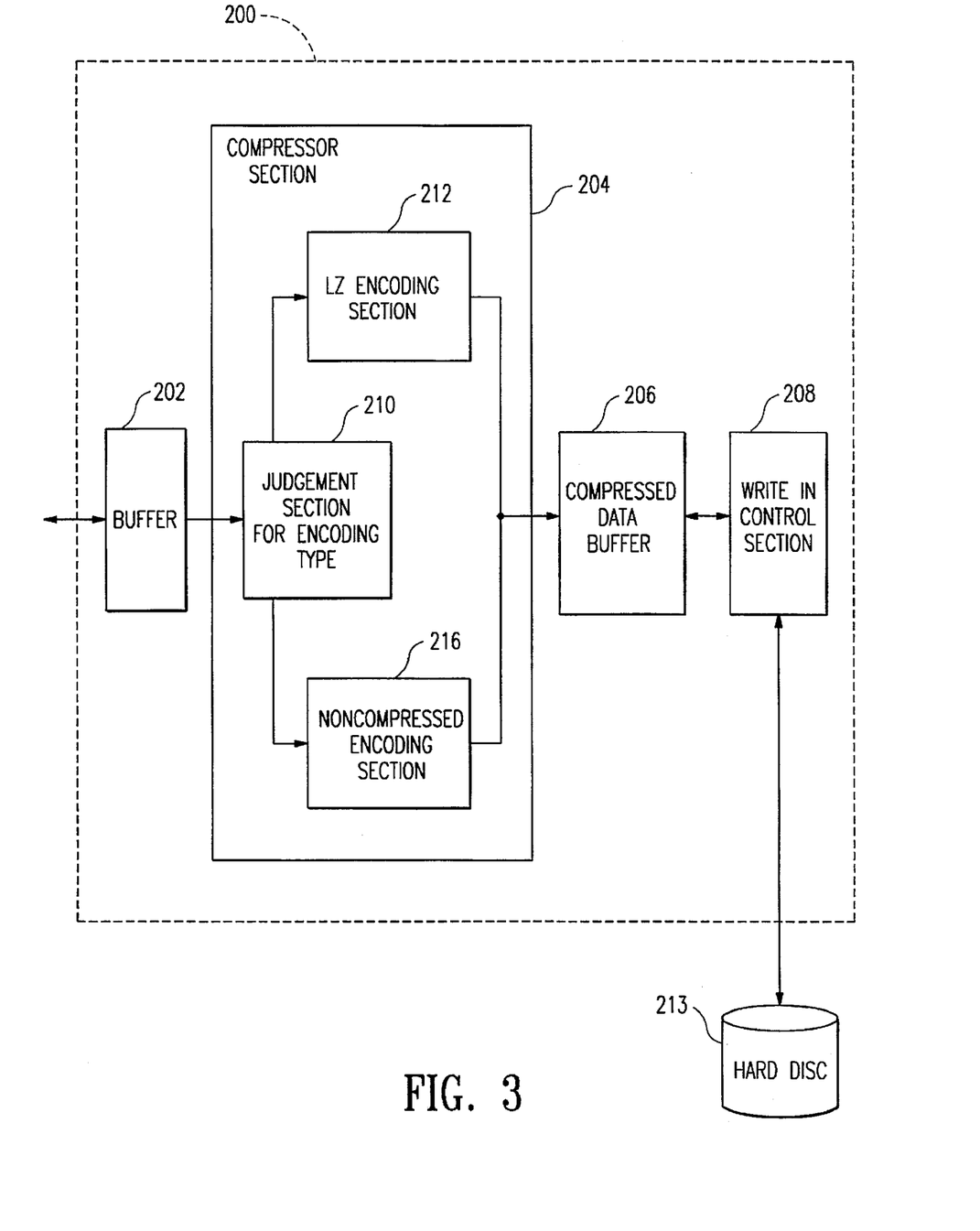
FIG. 3 is a functional block diagram of compression-expansion device driver 200 for compressing and expanding data according to a preferred embodiment.

FIG. 3 is a functional block diagram showing the configuration of compression-expansion device driver 200 which compresses and expands data under the reversible encoding method of a preferred embodiment. This compression-expansion device driver 200 is realized when CPU 101 executes a program stored in RAM 105. Compression-expansion device driver 200 is equipped with cluster buffer 202 which stores one cluster portion of data to be compressed or decompressed. Compression section 204 compresses data under the reversible encoding method. Compressed data buffer 206 which stores compressed data (encoded data strings). Write control section 208 writes compressed data into hard disk 123. Read control section 209 reads compressed data from hard disk 123. Single clusters are in predetermined data sizes, such as 8K bytes.

Compression section 204 includes encoding type detection section 210, which determines the type of encoding to be performed, LZ encoding section 212, which performs encoding under the Lempel-Ziv method, and noncompressed encoding section 216 which performs encoding on noncompressed type data. Decompression section 205 includes decoding type detection section 211 which determines the type of decoding to be performed, LZ decoding section 213 which performs decoding according to the Lempel-Ziv method, and noncompressed decoding section 217 which performs decoding on noncompressed type data. The following explains the encoding into LZ-type data units through LZ encoding section 212. In this example, "Coding Type" and "Coding Mode" mean the same. Also, "Compressed Data" and "Coding Data" are also used in the same context.

Figure 4:
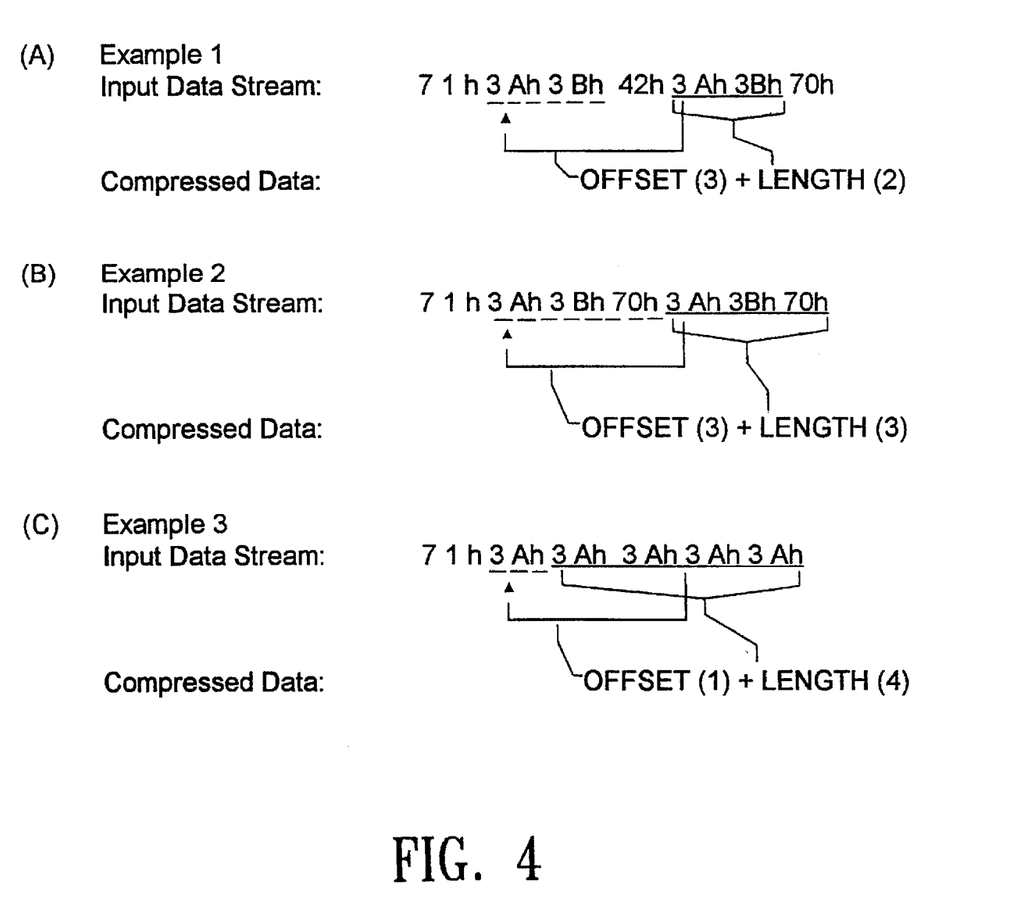
FIGS. 4(A)-4(C) are diagrams showing an example of encoding data according to the Lempel-Ziv method of data compression.

FIG. 4 is a diagram of the encoding method for the LZ type. The encoding used in the LZ type for this execution example is the Lempel-Ziv type method employing a slide dictionary method. In the example shown in FIG. 4(A), the input data stream includes byte string [71h 3Ah 3Bh . . .]. The added code [h] shows that data is described in hexadecimal figures.

In determining whether input data is to be encoded into LZ type data, it is first determined whether or not the same byte string over at least a predetermined number of bytes (preferably at least two bytes) had previously appeared, and if so, the system looks for the longest matching byte string. If there is such a match, the byte string is encoded with the separation (offset) from the previous matching byte string and the number of bytes (length) of the longest matching byte string. For example, as shown in FIG. 4(A), the two-byte string [3Ah 3Bh] with the solid underline matches the two-byte string with the broken under line. Therefore, the compressed data (encoded data) of two-byte string [3Ah 3Bh] with the solid underline is expressed by combining code word OFFSET (3), expressing the separation between matching byte strings and the code word LENGTH (2) that expresses the matching length. The number in the parenthesis for OFFSET (3) shows the separation (number of bytes for example), and the number in the parenthesis for LENGTH (3) shows the matching length (number of bytes for example).

In the example shown in FIG. 4(B), as the offset is three bytes and the matching length is three bytes, the three-byte string with the solid underline is encoded by combining code word OFFSET (3) and code word LENGTH (3). In the FIG. 4(C) example, the four bytes after the second byte are the same. In this case, the four bytes after the third byte with the solid underline will match with the four bytes after the second byte. Therefore, the offset is one byte and the matching length is 4 bytes.

As explained above, the LZ type encoding method compresses data with the longest matching byte string when the data matches a previous string over a predetermined length. Therefore, this is suited for compressing data where the same byte string repeatedly appears.

The format for the encoded data stream according to the first embodiment is illustrated below.

<NCS> <LZS> <NCS> <LZS>. . . <END> where:

<NCS >: Noncompressed data strings

<LZS >: LZ compressed data strings

<END >: End marker

In the first embodiment, the noncompressed data strings NCS and LZ compressed data strings LZS are interleaved with end marker END appended at the end. Noncompressed data string NCS is an encoded data string that includes noncompressed byte data, and LZ compressed data string LZS includes LZ-type encoded data units. Since the first data byte of the input data is preferably not encoded under the LZ-type method, the initial data in the encoded data stream is a noncompressed data string. Moreover, the symbol <> in the drawing is a sign of convenience to show the delineation of compressed data and does not exist in the actual compressed data.

The data format for noncompressed data strings according to a preferred embodiment is shown below.

$$<NCS> = <WN> \frac{<RAW><RAW>\ldots<RAW>}{N\text{ Units}}$$

where:

<RAW>: Noncompressed byte data (b bits)

<WN>: N units of noncompressed byte data (Wyle code)

Each noncompressed data string includes a Wyle code word WN that indicates an N numbers of noncompressed data bytes (RAW) in the noncompressed data string. Noncompressed data byte RAW is preferably 8 bits in length. However, bytes of different sizes may be used. Wyle code word WN is a variable length code word with different number of bits in accordance with the scope of number of units as shown in Table 1 below. The [x] in Table 1 indicates that this is a bit that can take the values 0 or 1.

TABLE 1

| Code Word (WN) | N Units |
|---|---|
| 0X | 1–2 |
| 10XX | 3–6 |
| 110XXX | 7–14 |
| 1110XXXX | 15–30 |
| 11110XXXXX | 31–62 |
| . . . | . . . |

As shown above, noncompressed data string NCS is configured by code word WN, that indicates the N units of noncompressed byte data. Accordingly, it is possible to maintain the overall compression ratio relatively high even in the event the encoded data stream has a high percentage of noncompressed byte data because it is not necessary to attach a prefix to each noncompressed data byte RAW.

The data format for LZ compressed data strings according to a preferred embodiment is shown below.

$$<LZS> = <WN> \underbrace{<LZ><LZ>\ldots<LZ>}_{N \text{ Units}}$$

where:
    <WN>: N units of noncompressed byte data (Wyle code)
    <LZ>: LZ compressed data
    <LZ>=<OFFSET> <LENGTH>
    <OFFSET>: Separation (offset) of coinciding byte rows
    <LENGTH>: Matching length (Wyle code)

Each LZ compressed data string includes a Wyle code word WN that indicates N units of LZ compressed data. Wyle code word WN for the LZ compressed data strings preferably has the same format as the Wyle code word for the noncompressed data strings as indicated in Table 1. Each LZ compressed data unit includes a code word OFFSET that indicates the separation of matching byte strings and code word LENGTH that indicates the matching length. Specific examples are set forth in Tables 2 and 3. As shown in Table 2 below, code word OFFSET can use 11 bits to express a separation of up to 2047 bytes.

TABLE 2

| Code Word <OFFSET> | Separation |
| --- | --- |
| XXXXXXXXXXX (11 bits) | 0–2047 units |

As shown in Table 3 below, code word LENGTH indicates that matching length is a variable length code word.

TABLE 3

| Code Word <LENGTH> | Matching Length |
| --- | --- |
| 0X | 2–3 |
| 10XX | 4–7 |
| 110XXX | 8–15 |
| 1110XXXX | 16–31 |
| 11110XXXXX | 32–63 |
| ... | ... |

As shown above in the format of LZ compressed data string LZS according to a preferred embodiment and in Table 3 above, LZ compressed data string LZS is configured by using code word WN that indicates N LZ compressed data units. Accordingly, it is possible to further enhance the compression ratio in the event that the encoded data stream has a continuous series of LZ type compressed data units because it is not necessary to add a prefix in front of each LZ type compressed data LZ units.

As discussed above, the noncompressed data strings NCS and LZ compressed strings LZS in this embodiment do not require inclusion of a prefix or a suffix to indicate the type of data strings. This is because, as shown above in the format of an encoded data stream according to the first embodiment, the noncompressed data strings NCS and LZ compressed data strings LZS are identifiable without any prefix or suffix on respective data strings since they are alternately arranged. Moreover, while one may add prefix or suffix to the respective data strings, a format without prefix or suffix would further enhance the compression ratio.

Figure 5A:
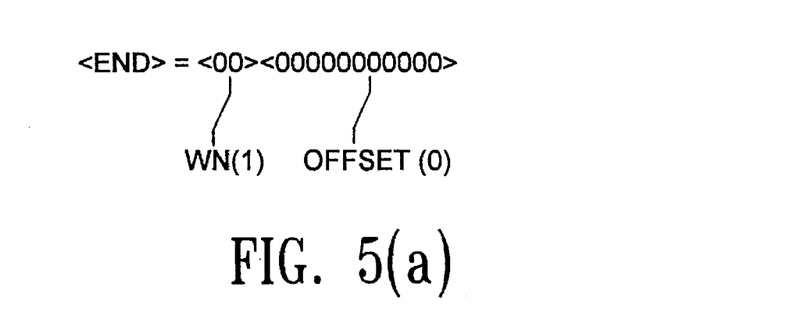
FIGS. 5(A) and 5(B) are diagrams showing the insertion of an end marker according to a preferred embodiment of the present invention.
Figure 5B:
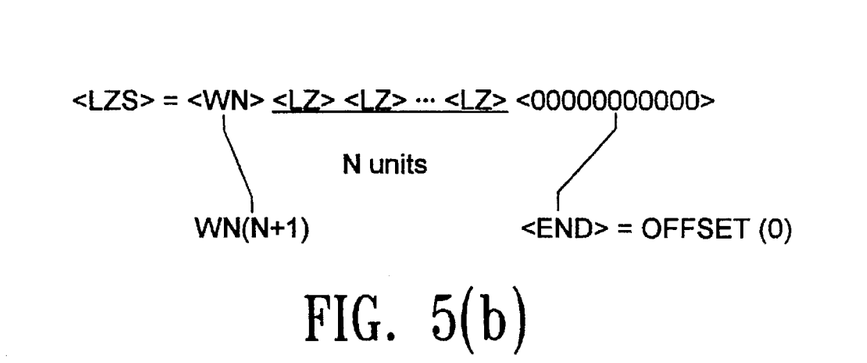

FIG. 5 illustrates the data format for the end marker. The end marker takes the format shown in FIG. 5(A) in the event the end of an encoded data stream is a noncompressed data string NCS, and takes the format shown in FIG. 5(B) when the end of the encoded data stream is an LZ compressed data string LZS. In the format showing FIG. 5(A), code word OFFSET, indicating a separation of zero, is attached to the end of Wyle code WN (see FIG. 5) that shows that value N is one. Also, the value (all zero) of code word OFFSET used as end marker can be any special value that is not used for purposes other than end marker. Any other value will be available. In the format of FIG. 5(B), the Wyle code word WN preceding the trailing LZS compressed data string shows that LZ compressed data continues for N+1. Code word OFFSET showing the separation with the N number of LZ compressed data units as zero, is added. The N LZ compressed data units are preferably indicated in the same as in normal LZ compressed data strings. Also, any uniquely decodable code word can uniformly be used as the end marker. It is also possible to use other forms of an end marker.

Figure 6:
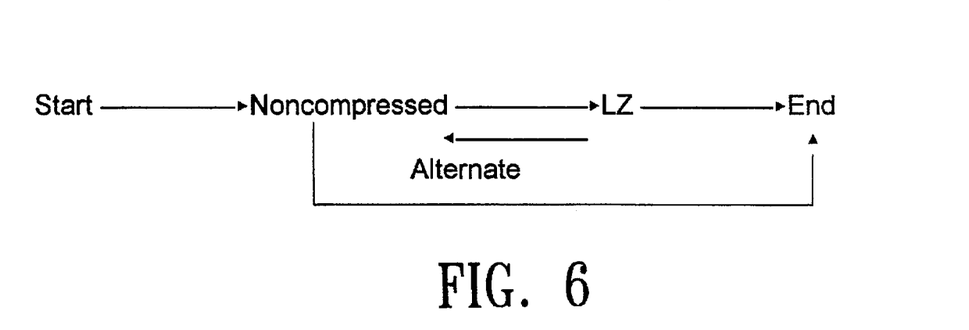
FIG. 6 is a state transition diagram of the encoding process according to a first embodiment.
Figure 7:
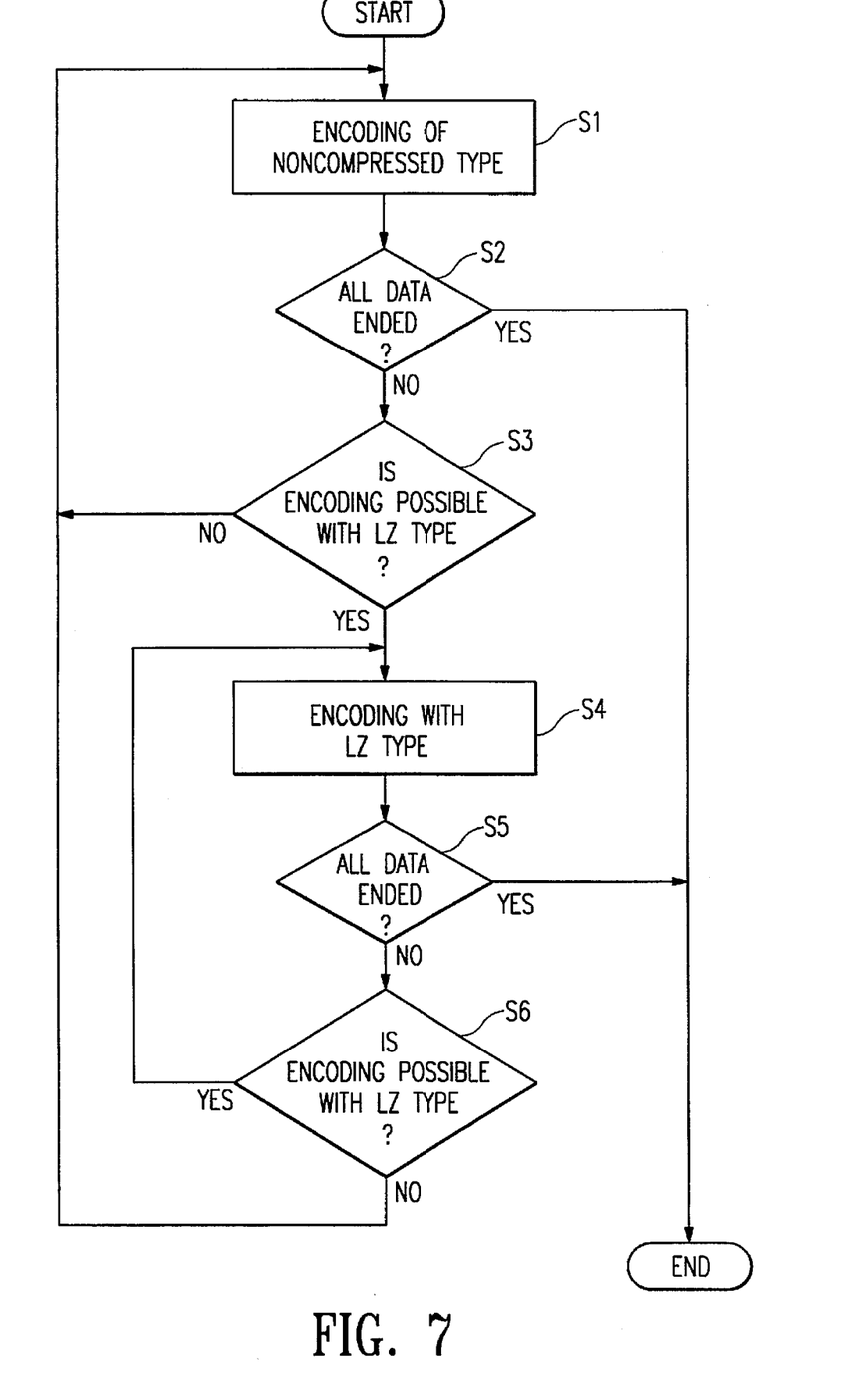
FIG. 7 is a flow chart showing the procedure of the encoding process according to a preferred embodiment of the present invention.
Figure 8A:
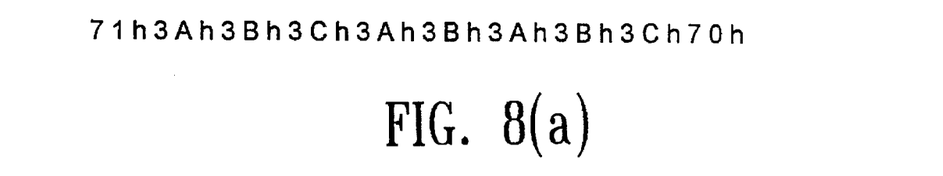
FIGS. 8(A)-8(D) and 9(A)-9(B) are diagrams showing an example of how a data stream is encoded according to a preferred embodiment.
Figure 8B:
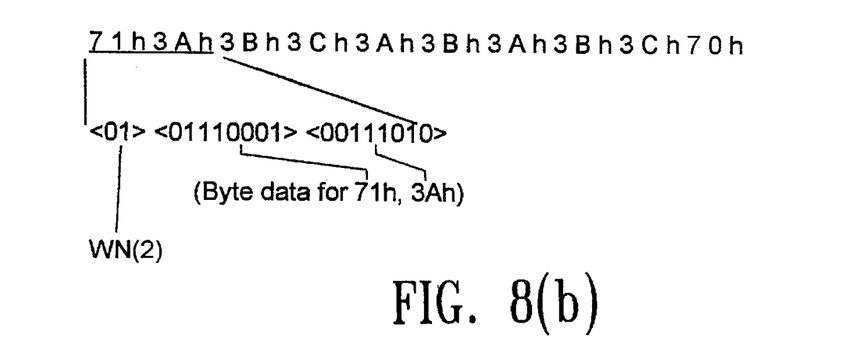
Figure 8C:
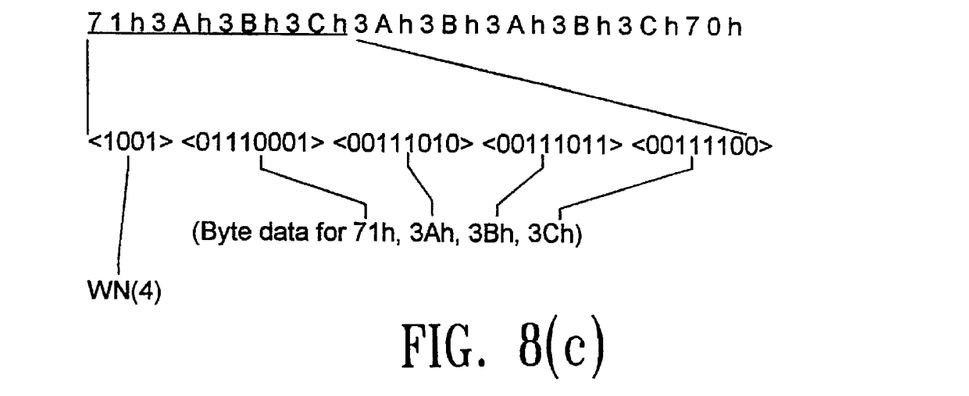

FIG. 6 is a transition diagram for the encoding process according to a first embodiment. As shown in FIG. 6, the first embodiment generates an encoded data stream having noncompressed type data and LZ type data interleaved. FIG. 7 is a flow chart showing the procedures of an encoding process for a set of input data stored in Buffer 202 (FIG. 3). Also, FIGS. 8 and 9 illustrate the encoding process in the execution example. In the example of FIG. 8(A), the input data stream is configured in 10 bytes for the sake of simplicity. The value surrounded by the symbol <> indicates that the code word in binary form.

The first two-byte [71 h 3Ah] input data sequence is preferably encoded as noncompressed bytes in step S1. As shown in FIG. 8(B), the two-byte noncompressed data string consists of Wyle code word WN(2) which shows that the unit N is 2, and the first two bytes of byte data. In step S2, it is determined whether unprocessed input data are stored in buffer 202. If there is unprocessed input data, at step S3 it is determined whether or not the next two bytes after the input data can be encoded with LZ type data units. Bytes of data are encoded into LZ type data units when there is a previously encoded byte string having at least two bytes long matching at least two consecutive bytes of the data to be encoded. When this encoding condition is met, at least the byte row containing these at least two bytes will be encoded with an LZ type data unit. Alternatively, this condition could require a match of more than two consecutive bytes.

Since the number three and four bytes [3Bh 2Ch] of the input data in FIG. 8(A) do not satisfy the encoding condition for matching at least two consecutive bytes as set forth above, the processing step returns to step S1 from step S3, and byte data [3Bh] of the third byte is appended to the noncompressed data strings, and Wyle code word WN that indicates the number of noncompressed byte data is renewed accordingly.

Similarly, since the fourth and fifth bytes [3Ch 3Ah] do not satisfy the LZ encoding condition, the byte data of the fourth byte [3Ch] is also appended to noncompressed data strings. As a result, the encoded data row for the first 4 bytes, as shown in FIG. 8(C), becomes a noncompressed data string consisting of Wyle code(4) word WN, that shows that the number N is 4, and four noncompressed data bytes.

Figure 8D:
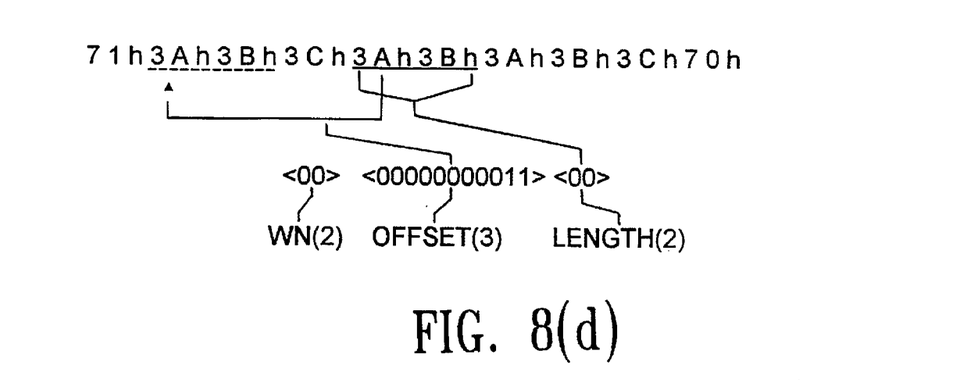
Figure 9A:
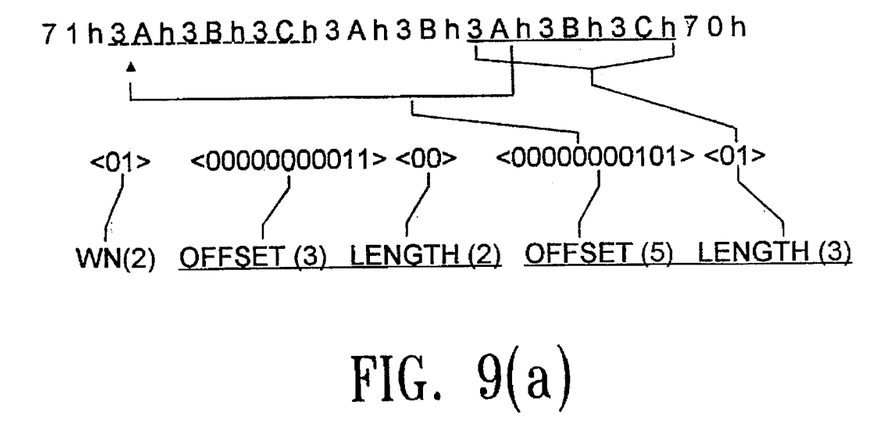
Figure 9B:
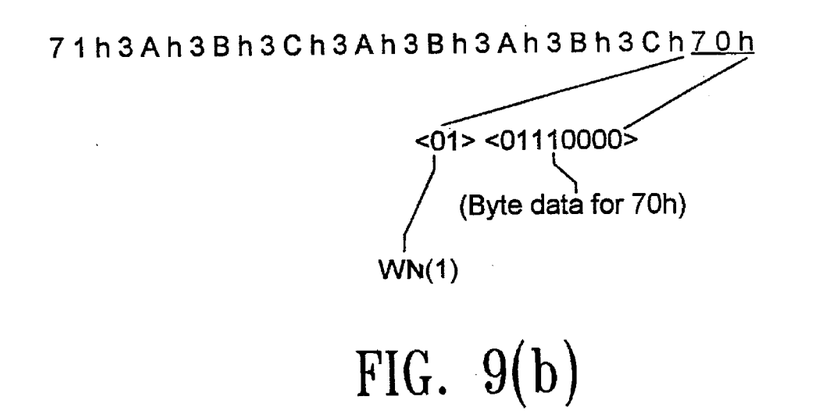

As shown in FIG. 8(D), the fifth and sixth bytes [3Ah 3Bh] match the second and third bytes. At that point, the process moves from step S3 to step S4 and a byte string starting at the fifth byte is encoded with LZ type data units. Since the maximum matching length of byte string after the fifth byte is two, the two-byte portion of fifth and sixth bytes is converted to LZ-type compressed data and appended to the encoded data row. The LZ compressed data unit corresponding to the fifth and sixth bytes, as shown in FIG. 8(D), consists of Wyle code WN (1), that indicates that unit N is 1, the code word OFFSET (3) that indicates that the separation is three, and code word LENGTH (2) that indicates that the matching length is two bytes.

At step S5, it is determined whether or not unprocessed input data exists in buffer 202, as in the case of step S2. If it exists, a determination is made in step S6 as to whether the two bytes (seventh and eight bytes [3Ah 3Bh]) following the input data can be encoded with LZ type compressed data. As shown in FIG. 9(A), the longest previous byte string that matches the byte strings starting with after the seventh byte is that of the second to fourth bytes. Therefore, the seventh to ninth bytes are encoded with an LZ type data unit at step S4 (FIG. 8(D)), and Wyle code word WN is renewed. As a result, the encoded data string for the fifth to ninth bytes, as shown in FIG. 9(A) becomes an LZ compressed data string including Wyle code word WN (2). This indicates that unit N is 2 and identifies the LZ compressed data for fifth and sixth bytes of the input data stream (first LZ unit) and the LZ compressed data for the seventh to ninth bytes of the input data stream (second LZ unit).

The process returns to step S1 from step S6 because the tenth byte [70h] cannot be encoded with an LZ type data unit. As a result, the noncompressed data string of the tenth byte shown in FIG. 9(B) is appended to the encoded data row. In this manner, the LZ type data units and the noncompressed type data units are interleaved. When all of the input data strings in buffer 202 are encoded, the end marker is appended to the end of the encoded data stream as discussed above in connection with the format of the encoded data according to a first embodiment. In the data stream shown in FIGS. 9(A) and 9(B), the end marker as shown in FIG. 5(A) is used because the trailing portion of the encoded data stream is a noncompressed data string.

The encoded data generated by the LZ encoding section 212 and noncompressed encoding section 216 are appended in sequence to the encoded data stream stored by compressed data buffer 206. If the end marker is added, the encoded data stream stored in compressed data buffer 206 is written to Disk 123 by write in control section 208. At the same time, the next input data stream is read into buffer 202, and the encoding process, as shown in FIG. 7, is repeated.

Steps S2, S3, S5 and S6 of FIG. 7 are executed by encoding type judgement section 210 (FIG. 3), and step S1 is executed by noncompressed encoding section 216 and step S4 is executed by LZ encoding section 212. In the first embodiment explained above, a code word WN indicates an N number of noncompressed data units in a string of N consecutive noncompressed data units or an N number of consecutive LZ compressed data units that are appended to the encoded data stream. As a result, the compression ratio can be improved over conventional Lempel-Ziv data compression techniques since it is not necessary to add a prefix or suffix to each encoding data unit to indicate the type of data therein. Moreover, since the noncompressed data strings and LZ compressed data strings are interleaved, there is no need to attach a prefix or suffix to the respective data strings to indicate their types. Thus, the compression ratio is enhanced.

The format of an encoded data stream according to a second embodiment is shown below.
<NCS> <LZf> <NCS> <LZf>... <END>
where:
    <NCS>: Noncompressed data strings
    <LZf>: LZ compressed data
    <END>: End marker
The encoded data stream in the second embodiment consists of noncompressed data strings NCS and LZ compressed data strings LZf, and end marker END. Each noncompressed data string NCS has the same format as the noncompressed data strings according to the first embodiment. LZ compressed data strings LZf, as explained below, have a format that differs from that of the LZS data strings shown in the execution of the first embodiment.

Figure 10:
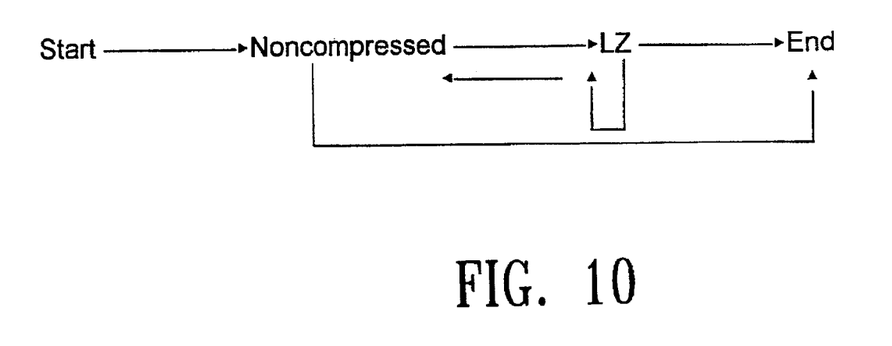
FIG. 10 is a state transition diagram of the encoding process according to a second embodiment.

FIG. 10 is a state transition diagram describing the process of encoding data according to the second embodiment. In the second embodiment, LZ compressed data units follow noncompressed data strings. Following the encoding of an LZ unit, the encoding of either a noncompressed byte or LZ compressed data unit follows. Therefore, as shown in the previously explained example in connection with the format of the encoded data stream according to a second embodiment, the LZ compressed data unit LZf can be attached to the end of the noncompressed data string NCS following the N bytes of noncompressed data as indicated by the Wyle code. However, either a noncompressed data string NCS or a second LZ compressed data unit LZf is attached to a first LZ compressed data unit LZf.

The format of LZ compressed data units LZf in the execution of the second embodiment is illustrated below.
<LZf>=<OFFSET> <LENGTH> <FLAG>
where:
    <FLAG>: Suffix indicating the type for the next unit compressed data
    <FLAG >=0: Noncompressed data string
    <FLAG>=1: LZ compressed data
This LZ compressed data unit LZf has the suffix FLAG, indicating the type of the next unit encoding data attached behind the code word OFFSET (the separation between a matching data string and encoded data) and code word LENGTH (matching length). For example, a value of the suffix FLAG as zero could indicate that the following unit encoding data is a noncompressed data string. In this example, the value of one would indicate that the next unit encoding data is an LZ compressed data unit LZf. As LZ compressed data LZf (or an end marker) is invariably attached following noncompressed data strings, it is not necessary to attached a suffix to the noncompressed data strings. Alternatively, if the data compression scheme encoded a stream with more than two types of data units, the suffix FLAG could have more than one bit so that the suffix FLAG could indicate the type of data unit that immediately followed (this could require including suffixes to the data units of more than just one of the types).

The format of the noncompressed data string NCS in the execution of the second embodiment is preferably the same as that used in the execution of the first embodiment. Therefore, even if the data stream is encoded with a high percentage of noncompressed data bytes, the compression ratio of the whole can be maintained at a high level. Also, the suffix that indicates the type of unit encoding data is necessary only for LZ compressed data units LZf (since in this embodiment there are only two types of encoding data types). Since the suffix is not necessary for noncompressed data strings NCS, the compression ratio is further enhanced over the conventional Lempel-Ziv method.

This invention is not limited to the above embodiments, but can be applied in various forms in so far as it does not depart from the essence of the invention. Other variations are also possible. For example, it is possible to use the Wyle code word WN table for applications other than those shown in Table 1. Also, code words other than the Wyle code word can be used to indicate the number of encoded units in a data string having consecutive units of the same type. As for the types of encoding, other encoding type units can be added to the noncompressed and LZ types. In this case, a prefix or suffix for showing the type of unit encoding data used may be necessary. However, if the aforementioned noncompressed data string NCS format is used, the compression ratio can be maintained at a relatively high level by incorporating the same principles.

In the above embodiments, the code word OFFSET, indicating the separation of matching data strings, had been set at a fixed length of 11 bits. Having a code word with variable length corresponding to the length can also be used. In the above embodiments the shortest data length for performing LZ type encoding had been set at two bytes, but the shortest byte length can be set at any arbitrary length over two bytes.

As explained above, the embodiments of the present invention set forth above can obtain a relatively high compression ratio if there is a high percentage of noncompressed data bytes generated in the encoded stream. This is achieved by configuring the encoded data stream such that strings of consecutive noncompressed data bytes require only a first code word that indicates the quantity of noncompressed byte data in the string rather than a prefix for every byte within the string.

What is claimed is:

1. A method of data compression to encode a plurality of sequential data bytes to provide an encoded data stream, the encoded data stream including noncompressed data strings interleaved with compressed data strings, each compressed data string having a plurality of consecutive compressed data units, each compressed data unit indicating a length and an offset, each compressed data unit corresponding to at least a first predetermined number of sequential data bytes, each noncompressed data string having a plurality of consecutive noncompressed data bytes, each noncompressed data byte corresponding to one of the sequential data bytes, the encoded data stream having an initial noncompressed data string having at least a second predetermined number of consecutive bytes, the method comprising the steps of:

comparing the plurality of sequential data bytes that are not encoded to the encoded data stream to determine the longest match therewith;

appending to the encoded data stream a compressed data unit corresponding to the match for each match of at least the first predetermined number of sequential data bytes that are not encoded, the compressed data unit indicating the length of the match and the offset between the data unit and the matching encoded data;

appending to the encoded data stream a noncompressed data byte for each sequential data byte not contained in any match of at least the first predetermined number of sequential data bytes that are not encoded;

inserting into each noncompressed data string a code indicating the number of consecutive bytes in the noncompressed data string; and inserting into each compressed data string a code indicating the number of compressed data units in the compressed data string.

2. The method of claim 1 wherein the compressed data units comprise one byte of data bits, a first portion of data bits indicating the length and a second portion of the data bits indicating the offset.

3. The method of claim 1 wherein the code inserted into each noncompressed data string is a Wyle code that precedes the first byte of encoded data noncompressed data string.

4. The method of claim 1 wherein the code inserted into each compressed data string is a Wyle code that precedes the first compressed data unit.

5. A method of data compression to encode a plurality of sequential data bytes to provide an encoded data stream, the encoded data stream including noncompressed data strings interleaved with compressed data strings, each compressed data string having a plurality of consecutive compressed data units, each compressed data unit indicating a length and an offset, each compressed data unit corresponding to at least a first predetermined number of consecutive sequential data bytes, each noncompressed data string having a plurality of consecutive noncompressed data bytes, each noncompressed data byte corresponding to one of the sequential data bytes, the encoded data stream having an initial noncompressed data string having at least a second predetermined number of consecutive bytes beginning at the start of the plurality of sequential data bytes, the method comprising the steps of:

comparing the plurality of sequential data bytes that are not encoded to the encoded data stream to determine the longest match therewith;

appending to the encoded data a compressed data unit corresponding to the match for each match of at least a first predetermined number of sequential data bytes that are not encoded, the compressed data unit indicating the length of the match, and the offset of the data unit to the matching encoded data;

appending to the encoded data stream a noncompressed data byte for each sequential data byte not contained in any match of at least the first predetermined number of sequential data bytes that are not encoded; and inserting into each noncompressed data string a code indicating the number of consecutive bytes in the noncompressed data string, wherein each compressed data unit further indicating whether a noncompressed data byte immediately follows.

6. The method of claim 5 wherein the code inserted into each noncompressed data string is a Wyle code that precedes the first byte of encoded data in the noncompressed data string.

7. The method of claim 5 wherein each compressed data unit includes a suffix indicating whether the data immediately following is a noncompressed data string or a compressed data unit.

8. A method of decoding an encoded data stream to provide a plurality of sequential data the encoded data stream including noncompressed data strings interleaved with compressed data strings, each compressed data string having a plurality of consecutive compressed data units and a code indicating the number of compressed data units in the compressed data string, each compressed data unit indicating a length and an offset, the length indicating the number of bytes of matching uncompressed data, the offset indicating the separation of the compressed data unit from the matching uncompressed data bytes, each compressed data unit corresponding to at least a first predetermined number of consecutive sequential data bytes, each noncompressed data string having a plurality of consecutive noncompressed data bytes and a code indicating the number of consecutive bytes in the noncompressed data stream, each noncompressed data byte corresponding to one of the sequential data bytes, the encoded data stream having an initial noncompressed data string having at least a second predetermined number of consecutive bytes beginning at the start of the plurality of sequential data bytes, the method comprising the steps of:

receiving the encoded data stream from a source;

detecting the code of each noncompressed data string to determine a count of the corresponding data bytes to be appended to the plurality of sequential data bytes;

appending the corresponding noncompressed data bytes to the plurality of sequential data bytes according to the detected count for each noncompressed data string;

detecting the code of each compressed data string to determine a count of the compressed data units in the compressed data string;

determining the offset and length of each compressed data unit in each compressed data string;

forming a string of contiguous data bytes matching the contiguous portion of the sequential data bytes starting at a location determined by the offset relative to the compressed data unit and having a length determined by the length of the compressed data unit for each compressed data unit; and appending each string of contiguous data bytes formed from the compressed data units to the plurality of sequential data bytes.

9. The method of claim 8 wherein the compressed data units comprise one byte of data bits, a first portion of the data bits indicating the length and a second portion of the data bits indicating the offset.

10. The method of claim 8 wherein the code inserted into each noncompressed data string is a Wyle code that precedes the first byte of encoded data in the noncompressed data string.

11. The method of claim 8 wherein the code inserted into each compressed data string is a Wyle code that precedes the first compressed data unit in the compressed data string.

12. A method of decoding an encoded data stream to provide a plurality of sequential data, the encoded data stream including noncompressed data strings interleaved with compressed data units, each compressed data unit indicating whether a noncompressed data byte immediately follows, each compressed data unit indicating a length and an offset, the length indicating the number of bytes of matching uncompressed data, the offset indicating the separation of the compressed data unit from the matching uncompressed data bytes, each compressed data unit corresponding to at least a first predetermined number of sequential data bytes, each noncompressed data string having a plurality of consecutive noncompressed data bytes and a code indicating the number of consecutive bytes in the noncompressed data stream, each noncompressed data byte corresponding to one of the sequential data bytes, the encoded data stream having an initial noncompressed data string having at least a second predetermined number of consecutive bytes beginning at the start of the plurality of sequential data bytes, the method comprising the steps of:

receiving the encoded data stream from a source;

detecting the code of each noncompressed data string to determine a count of the corresponding data bytes to be appended to the plurality of sequential data bytes;

appending the corresponding noncompressed data bytes according to the detected count for each noncompressed data string;

detecting each compressed data unit to determine the location of the matching noncompressed data bytes from the offset of the compressed data unit, the number of matching noncompressed data bytes represented by the data unit from the length, and determine whether a noncompressed data byte immediately follows the compressed data unit;

forming for each detected compressed data unit a string of contiguous data bytes corresponding to the contiguous portion of the sequential data bytes starting at a location determined by the offset of the compressed data unit relative to the compressed data unit and having a length determined by the length of the compressed data unit; and appending the string of contiguous data bytes formed from the detections of compressed data units to the plurality of sequential data bytes.

13. The method of claim 12 wherein the code inserted into each noncompressed data string is a Wyle code that precedes the first byte of encoded data in the noncompressed data string.

14. The method of claim 12 wherein each compressed data unit includes a suffix indicating whether the data immediately following is a noncompressed data string.

15. An apparatus for encoding a plurality of sequential data bytes, to provide an encoded data stream, the encoded data stream including noncompressed data strings interleaved with compressed data strings, each compressed data string having a plurality of consecutive compressed data units, each compressed data unit indicating a length and an offset, each compressed data unit corresponding to at least a first predetermined number of consecutive sequential data bytes, each noncompressed data string having a plurality of consecutive noncompressed data bytes, each noncompressed data byte corresponding to one of the sequential data bytes, the encoded data stream having an initial noncompressed data string having at least a second predetermined number of consecutive bytes corresponding to the start of the plurality of sequential data bytes, the apparatus comprising:

an encoding type detection section for comparing the plurality of sequential data bytes that are not encoded to the encoded data stream to determine the longest match therewith;

a compressed data encoder for appending to the encoded data stream compressed data units corresponding to matches of at least the first predetermined number of consecutive sequential data bytes that are not encoded, the compressed data unit indicating the length of the match and the offset between the data unit and the matching encoded data, and inserting into each compressed data string a code indicating the number of compressed data units in the compressed data string; and a noncompressed data encoder for appending to the encoded data stream a noncompressed data byte each sequential data byte not contained in any match of at least a first predetermined number of consecutive sequential data bytes that are not encoded, and inserting into each noncompressed data string a code indicating the number of consecutive bytes in the noncompressed data string.

16. The apparatus of claim 15 wherein the compressed data units comprise one byte of data bits, a first portion of the data bits indicating the length and a second portion of the data bits indicating the offset.

17. The apparatus of claim 15 wherein the code inserted into each noncompressed data string is a Wyle code that precedes the first byte of encoded data.

18. The apparatus of claim 15 wherein the code inserted into each noncompressed data string is a Wyle code that precedes the first compressed data unit.

19. An apparatus for encoding a plurality of sequential data bytes, to provide an encoded data stream, the encoded data stream including noncompressed data strings interleaved with compressed data strings, each compressed data string having a plurality of consecutive compressed data units, each compressed data unit indicating a length and an offset, each compressed data unit corresponding to at least a first predetermined number of consecutive sequential data bytes, each noncompressed data string having a plurality of consecutive noncompressed data bytes, each noncompressed data byte corresponding to one of the sequential data bytes, the encoded data stream having an initial noncompressed data string having at least a second predetermined number of consecutive bytes beginning at the start of the plurality of sequential data bytes, the apparatus comprising:

an encoding type detection section for comparing the plurality of sequential data bytes that are not encoded to the encoded data stream to determine the longest match therewith;

a compressed data encoder for appending to the encoded data a compressed data unit corresponding to the longest of matches of at least the first predetermined number of consecutive sequential data bytes with consecutive encoded data units, the compressed data unit indicating the length of the match, and the offset of the data unit to the matching encoded data; and a noncompressed data encoder for appending to the encoded data stream a noncompressed data byte for each sequential data byte not contained in any match of at least the first predetermined number of consecutive sequential data units that are encoded, and inserting each noncompressed data string a code indicating the number of consecutive bytes in the noncompressed data string, wherein each compressed data unit further indicating whether a noncompressed data byte immediately follows.

20. The apparatus of claim 19 wherein the code inserted into each noncompressed data string is a Wyle code that precedes the first byte of encoded data in the noncompressed data stream.

21. The apparatus of claim 19 wherein each compressed data unit includes a suffix indicating whether the data immediately following is a noncompressed data string or a compressed data unit.

22. An apparatus for decoding an encoded data stream to provide a plurality of sequential data bytes, the encoded data stream including noncompressed data strings interleaved with compressed data strings, each compressed data string having a plurality of consecutive compressed data units and a code indicating the number of compressed data units in the compressed data string, each compressed data unit indicating a length and an offset, the length indicating the number of bytes of matching uncompressed data, the offset indicating the separation of the compressed data unit from the matching uncompressed data bytes, each compressed data unit corresponding to at least a first predetermined number of consecutive sequential data bytes, each noncompressed data string having a plurality of consecutive noncompressed data bytes and a code indicating the number of consecutive bytes in the noncompressed data stream, each noncompressed data byte corresponding to one of the sequential data bytes, the encoded data stream having an initial noncompressed data string having at least a second predetermined number of consecutive bytes beginning at the start of the plurality of sequential data bytes, the apparatus comprising:

a buffer for receiving the encoded data stream from a source;

a noncompressed data detection section for detecting the code of each noncompressed data string to determine a count of corresponding data bytes to be appended to the plurality of sequential data bytes;

a noncompressed data decoder for appending the corresponding noncompressed data bytes according to the detected count for each noncompressed data string;

a compressed data detection section for detecting the code of each compressed data string to determine a count of the compressed data units in the compressed data string; and a compressed data unit decoder section for determining the offset and length of each compressed data unit in each compressed data string, forming a string of contiguous data bytes corresponding to the contiguous portion of the sequential data bytes starting at a location determined by the offset relative to the compressed data unit and having a length determined by the length of the compressed data unit for each compressed data unit, and appending the string of contiguous data bytes formed from the compressed data units to the plurality of sequential data bytes.

23. The apparatus of claim 22 wherein the compressed data units comprise one byte of data bits, a first portion of data bits indicating the length and a second portion of the data bits indicating the offset.

24. The apparatus of claim 22 wherein the code inserted into each noncompressed data string is a Wyle code that precedes the first byte of encoded data in the noncompressed data string.

25. The apparatus of claim 22 wherein the code inserted into each compressed data string is a Wyle code that precedes the first compressed data unit in the compressed data string.

26. An apparatus for decoding an encoded data stream to provide a plurality of sequential data bytes, the encoded data stream including noncompressed data strings interleaved with compressed data units, each compressed data unit indicating whether a noncompressed data byte immediately follows, each compressed data unit indicating a length and an offset, the length indicating the number of bytes of matching uncompressed data, the offset indicating the separation of the compressed data unit from the matching uncompressed data bytes, each compressed data unit corresponding to at least a first predetermined number of consecutive sequential data bytes, each noncompressed data string having a plurality of consecutive noncompressed data bytes and a code indicating the number of consecutive bytes in the noncompressed data stream, each noncompressed data byte corresponding to one of the sequential data bytes, the encoded data stream having an initial noncompressed data string having at least a second predetermined number of consecutive bytes beginning at the start of the plurality of sequential data bytes, the apparatus comprising:

a buffer for receiving the encoded data stream from a source;

a noncompressed data detection section for detecting the code of each noncompressed data string to determine a count of the corresponding data bytes to be appended to the plurality of sequential data bytes;

a noncompressed data decoder for appending the corresponding noncompressed data bytes according to the detected count for each noncompressed data string;

a compressed data detection section for detecting each compressed data unit to determine the location of the matching noncompressed data bytes from the offset of the compressed data unit, the number of matching noncompressed data bytes represented by the data unit from the length, and determine whether a noncompressed data byte immediately follows the compressed data unit; and a compressed data decoder for forming a string of contiguous data bytes corresponding to the contiguous portion of the sequential data bytes starting at a location determined by the offset relative to the compressed data unit and having a length determined by the length of the compressed data unit, and appending the string of contiguous data bytes formed from the detections of compressed data units to the plurality of sequential data bytes.

27. The apparatus of claim 26 wherein the code inserted into each noncompressed data string is a Wyle code that precedes the first byte of encoded data.

28. The apparatus of claim 26 wherein the code inserted into each noncompressed data string is a Wyle code that precedes the first compressed data unit.

29. The apparatus of claim 26 wherein each compressed data unit includes a suffix indicating whether the data immediately following is a noncompressed data string or a compressed data unit.

* * * * *